(12) United States Patent
Song et al.

(10) Patent No.: US 6,552,423 B2
(45) Date of Patent: Apr. 22, 2003

(54) HIGHER-DENSITY MEMORY CARD

(75) Inventors: Young-Jae Song, Cheonan (KR);
Young-Shin Kwon, Cheonan (KR);
Kun-Dae Youm, Asan (KR);
Young-Soo Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 19 days.

(21) Appl. No.: 09/785,810

(22) Filed: Feb. 15, 2001

(65) Prior Publication Data

US 2001/0015485 A1 Aug. 23, 2001

(30) Foreign Application Priority Data

Feb. 18, 2000 (KR) .......................................... 2000-7759

(51) Int. Cl.[7] .............................................. H01L 23/48
(52) U.S. Cl. ..................... 257/679; 257/685; 257/723; 257/777; 361/761
(58) Field of Search ................. 257/679, 685, 257/686, 687, 723, 730, 777; 206/706; 361/735, 737, 764, 761; 174/52.1, 52.4

(56) References Cited

U.S. PATENT DOCUMENTS

| | | | | |
|---|---|---|---|---|
| 5,508,565 A | * | 4/1996 | Hatakeyama et al. | 257/777 |
| 5,530,292 A | * | 6/1996 | Waki et al. | 257/724 |
| 5,583,748 A | * | 12/1996 | Gochi et al. | 361/784 |
| 5,910,685 A | * | 6/1999 | Watanabe | 257/777 |
| 5,939,779 A | * | 8/1999 | Kim | 257/692 |
| 6,262,488 B1 | * | 7/2001 | Masayuki et al. | 257/777 |
| 6,297,960 B1 | * | 10/2001 | Moden et al. | 361/719 |
| 6,222,265 B1 | * | 4/2002 | Akram et al. | 257/723 |
| 6,369,444 B1 | * | 4/2002 | Degani et al. | 257/724 |
| 6,239,496 B1 | * | 5/2002 | Asada | 257/777 |
| 6,383,845 B2 | * | 5/2002 | Masuda et al. | 438/123 |

* cited by examiner

*Primary Examiner*—Kamand Cuneo
*Assistant Examiner*—Lourdes Cruz
(74) *Attorney, Agent, or Firm*—Marger Johnson & McCollom P.C.

(57) ABSTRACT

A high-density memory card comprises a base card and two packages fixedly mounted within the base card. The two packages are attached to the base card and face each other. In one embodiment, a first package comprises a first substrate and at least one memory chip, and a second package comprises a second substrate and at least one memory chip. A first surface of the first substrate has external connection pads formed thereon and is exposed from the memory card. A second surface of the first substrate has first connection pads formed thereon. The memory chips are mounted on the second surface and electrically connected to each other. A third surface of the second substrate is exposed from the memory card, and a fourth surface of the second substrate has second connection pads formed thereon. The memory chips are mounted on the fourth surface and electrically connected to each other. The base card further includes internal connection means, and the first and the second connection pads are electrically connected to the internal connection means. The external connection pads provide electrical connection between said internal connection means to an external system. By connecting two packages to the base card, the memory card of the present invention can increase the memory density of the smart cart four times or more. Also, the problems encountered in the conventional smart card manufacturing process or the test process due to the use of plural memory chips can be prevented.

29 Claims, 6 Drawing Sheets

HIGHER-DENSITY MEMORY CARD

BACKGROUND OF THE INVENTION

1. Field of the Invention

The present invention relates to a semiconductor device, and more particularly to a semiconductor memory card.

2. Description of the Related Arts

A very small and light memory card used for storing and retrieving data for digital products such as a MP3 player or a digital camera is called "smart media card". Generally, the memory card contains non-volatile memory chips such as NAND-type or NOR-type flash memory chips and, if necessary, a controller chip.

Memory density, i.e., memory storage capacity, of the current memory card is several tens or hundreds of megabits. However, an increase of the memory density has been constantly required to keep up with rapid developments in modem digital technology. However, the rate of the increase of the memory density has not been sufficient. Thus, new and useful approaches to increase the memory density of the memory card are also required in addition to relying on the increase of the memory density of the memory chips.

One such approach to increasing the memory density of the memory card is to use a plurality of identical memory chips. For example, as shown in FIG. 1, two memory chips 13 are stacked, or as shown in FIG. 2, two memory chips 23 are mounted side by side.

Figure 1:
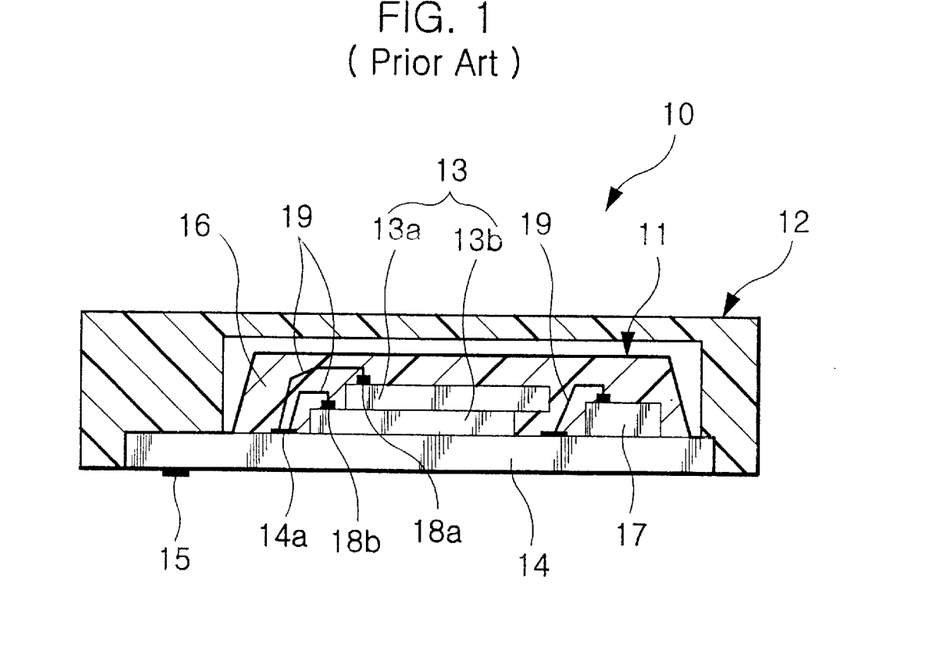
FIG. 1 is a cross-sectional view of a conventional memory card.
Figure 2:
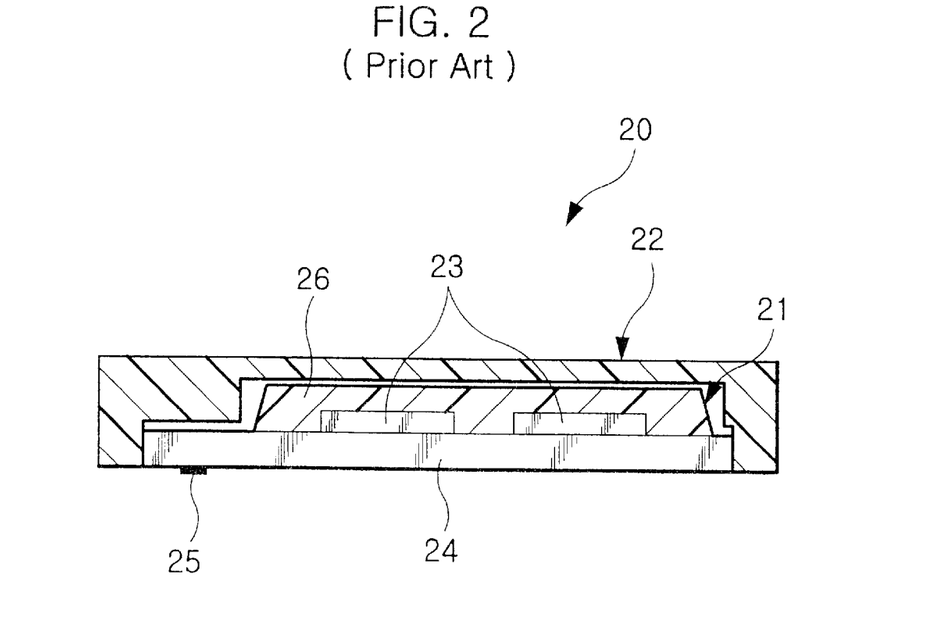
FIG. 2 is a cross-sectional view of another conventional memory card.

With reference to FIGS. 1 and 2, conventional memory card 10 or 20 has a structure where memory chips 13 or 23 are mounted within a package 11 or 21, and the packages 11 or 21 are positioned on a card body 12 or 22, i.e., "a base card." Herein, a printed circuit board 14 or 24 is used in the package 11 or 21, and the memory chips 13 or 23 are mounted on one of the surfaces of the printed circuit board 14 or 24 and a plurality of contact pads 15 or 25 are formed on the other surface of the printed circuit board 14 or 24. The memory chips 13 or 23 are electrically interconnected to the printed circuit board 14 or 24 by wire bonding or flip chip bonding and to the contact pads 15 or 25 through the wiring patterns and the via holes (not shown) of the printed circuit boards 14 or 24. The memory chips 13 or 23 are encapsulated with a molding resin 16, 26. As shown in FIG. 1, a controller chip 17 may be additionally used.

In the above-described conventional memory cards 10 or 20 it is difficult to mount more than two memory chips, unless the sizes of the memory chips 13 or 23 are reduced. Therefore, the density of the memory card as a whole cannot exceed twice the density of one memory chip.

Particularly, as shown in FIG. 1, the upper chip 13a should be off-set from an edge of the underlying lower chip 13b so as to expose the chip pads 18b of the lower chip 13b for electrical interconnection. Moreover, the chip pads 18a or 18b should be formed on the upper surface of each chip 13a or 13b along only one of the edges. In addition, the chip pads 18a, 18b of the upper and the lower chips 13a, 13b, respectively, perform the same function and are connected to pads 14a formed on the substrate via wire bonding. Therefore, the size of the pads 14a should be sufficiently large so that both the upper and lower bonding wires 19 can be electrically connected in common thereto. In the structure shown in above-described memory card 10, it is difficult to stack more than two memory chips 13 due to the following problems.

First, when the chips are stacked as shown in FIG. 1, more side space within the package is required if more chips are being stacked. However, in a standard memory card, the available space is very limited. Thus, the number of chips that can be stacked is restricted.

Second, if more chips are stacked, longer bonding wires should be used. However, the longer bonding wires may result in undesirable electrical shorts between adjacent wires by, for example, wire sweeping, a problem that is well known in the art.

Third, the warpage of the printed circuit board becomes serious due to the difference in the coefficient of thermal expansion between the chips and the board. Several problems such as delamination on interface, poor adhesion, difficulty in stacking of chips, are caused by the warpage.

Fourth, a package containing multiple chips may sometimes fail electrical or burn-in test steps due to one defective chip therein although the other chips are good. This causes great losses in yield, and therefore a so-called known good die (KGD) which is an unpackaged die that has been tested to a quality and reliability level equal to the packaged product before packaging are required for the multi-chip package.

Another conventional memory card as shown in FIG. 2 has been proposed to provide a solution to some of the problems described above, since chips are mounted side-by-side on the board without stacking. However, this memory card structure still has the above-mentioned problems, e.g., poor yield, because a single package includes multiple chips. Further, unless the size of the memory chip 23 is reduced, there still remains a drawback in that that the number of the memory chips mounted side-by-side within the package 21 that can be loaded is limited.

SUMMARY OF THE INVENTION

The present invention increases memory density of a memory card by improving the structure of the memory card. Particularly, the number of the memory chips within the memory card can be increased even without reducing the size of the memory chip or increasing the density of the memory chip.

The present invention further prevents several problems in the manufacturing process or the test process caused by using a plurality of the memory chips.

According to one embodiment of the present invention, a memory card comprises a base card and two packages connected to the base card. The two packages are attached to the base card and face each other. With reference to the two packages, a first package comprises a first substrate and at least one memory chip, and a second package comprises a second substrate and at least one memory chip. A first surface of the first substrate has external connection pads formed thereon and is exposed from the memory card. A second surface of the first substrate has first connection pads formed thereon and connected to the base card. The memory chips are mounted on the second surface and electrically connected to each other. A third surface of the second substrate is exposed from the memory card, and a fourth surface of the second substrate has second connection pads formed thereon and connected to the base card. The memory chips are mounted on the fourth surface and electrically connected to each other. The base card includes internal connection means, and the first and the second connection pads are electrically connected to the internal connection means. The external connection pads provide electrical connection between said internal connection means to an external system.

By connecting two packages to the base card, the memory card of the present invention can increase the memory density of the smart cart four times or more. Also, the problems encountered in the conventional smart card manufacturing process or the test process can be prevented.

BRIEF DESCRIPTION OF THE DRAWINGS

The various features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 3:
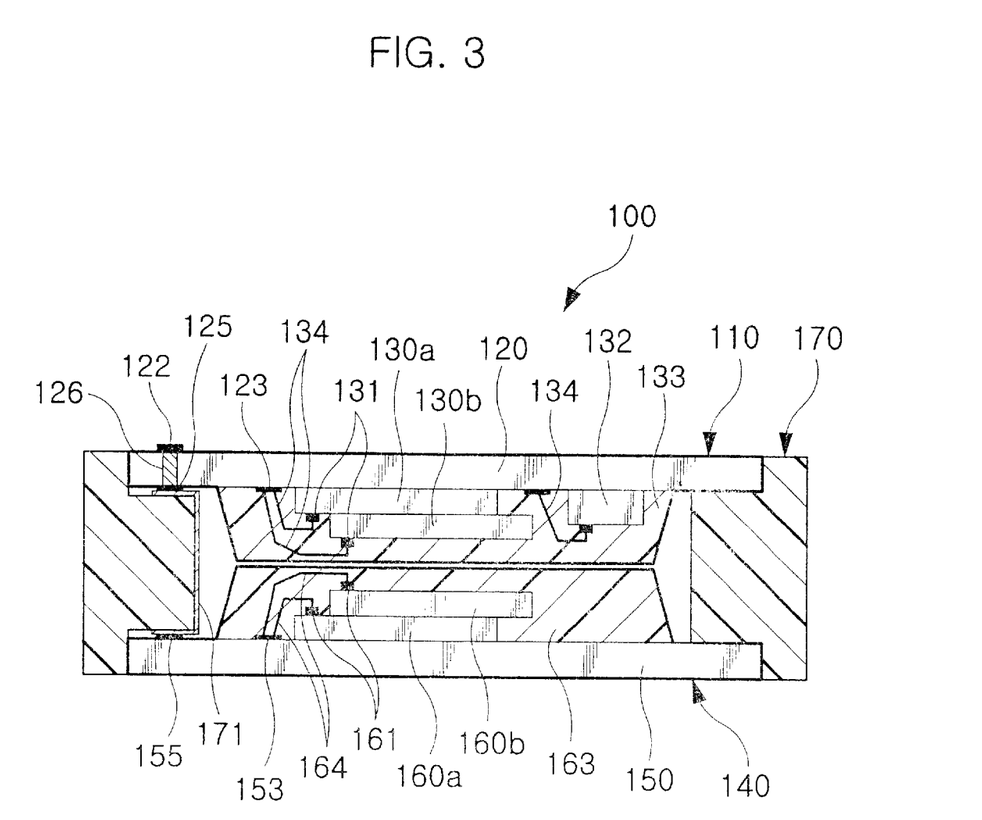
FIG. 3 is a cross-sectional view of a memory card in accordance with an embodiment of the present invention.

FIG. 3 is a cross-sectional view of a memory card 100 in accordance with an embodiment of the present invention. As shown in FIG. 3, the memory card 100 includes two packages 110, 140. Each package preferably includes two memory chips 130a, 130b or 160a, 160b. Thus, the memory card 100 has four-fold density. (Thus, the density of the memory card 100 is increased at least two times more than the density of a conventional memory card.) On the other hand, since each package 110 or 140 contains only two memory chips 130a, 130b or 160a, 160b therein, the problems shown in conventional memory card structure can be avoided.

Figure 4:
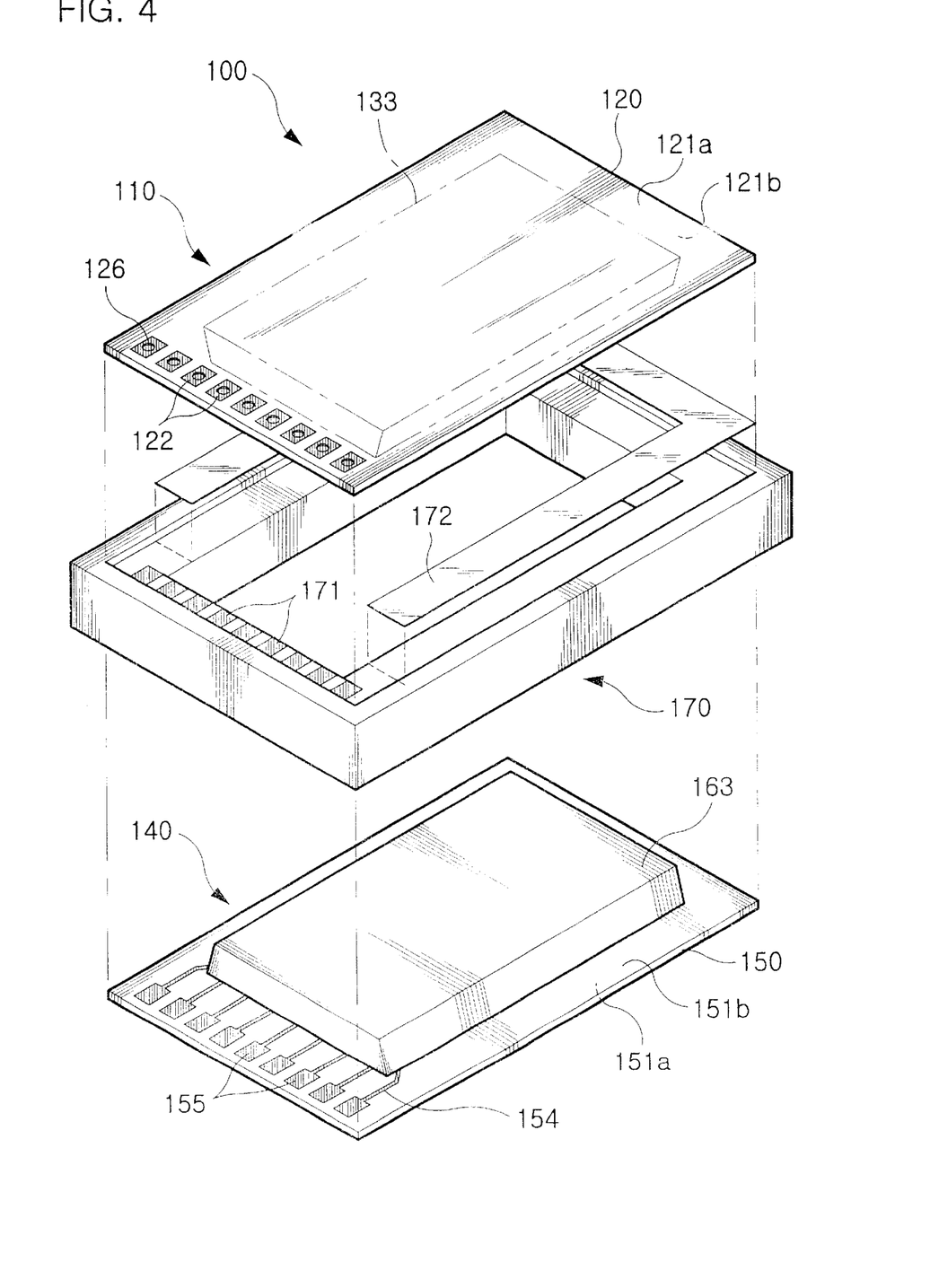
FIG. 4 is an exploded isometric view of the memory card of FIG. 3.
Figure 7:
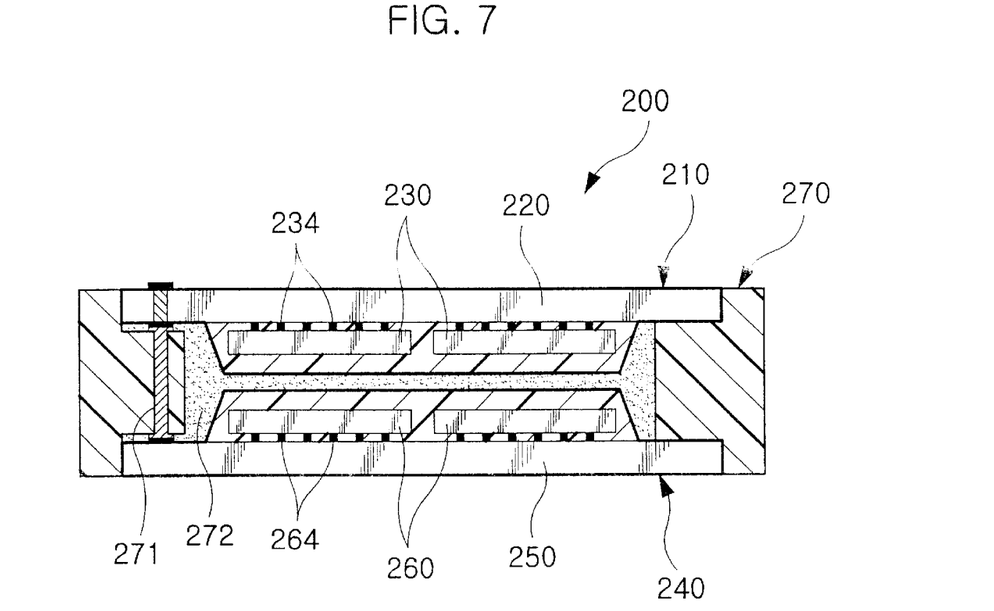
FIG. 7 is a cross-sectional view of a memory card in accordance with another embodiment of the present invention.

In order to place two packages 110, 140 within a single memory card 100, the base card 170 has a different structure from the conventional base card. FIG. 4 is an exploded isometric view of the memory card 100 of FIG. 3. With reference to FIGS. 3 and 4, the base card 170 has an opening in the center portion thereof. And upper and lower packages 110, 140 are inserted into the opening of the base card 170 from the top and the bottom thereof, respectively. Thus, two packages 110, 140 are face each other. The packages 110, 140 are physically attached to the base card 170 by an adhesion sheet 172. Alternatively, a liquid adhesive may be used, as shown in FIG. 7.

Figure 5:
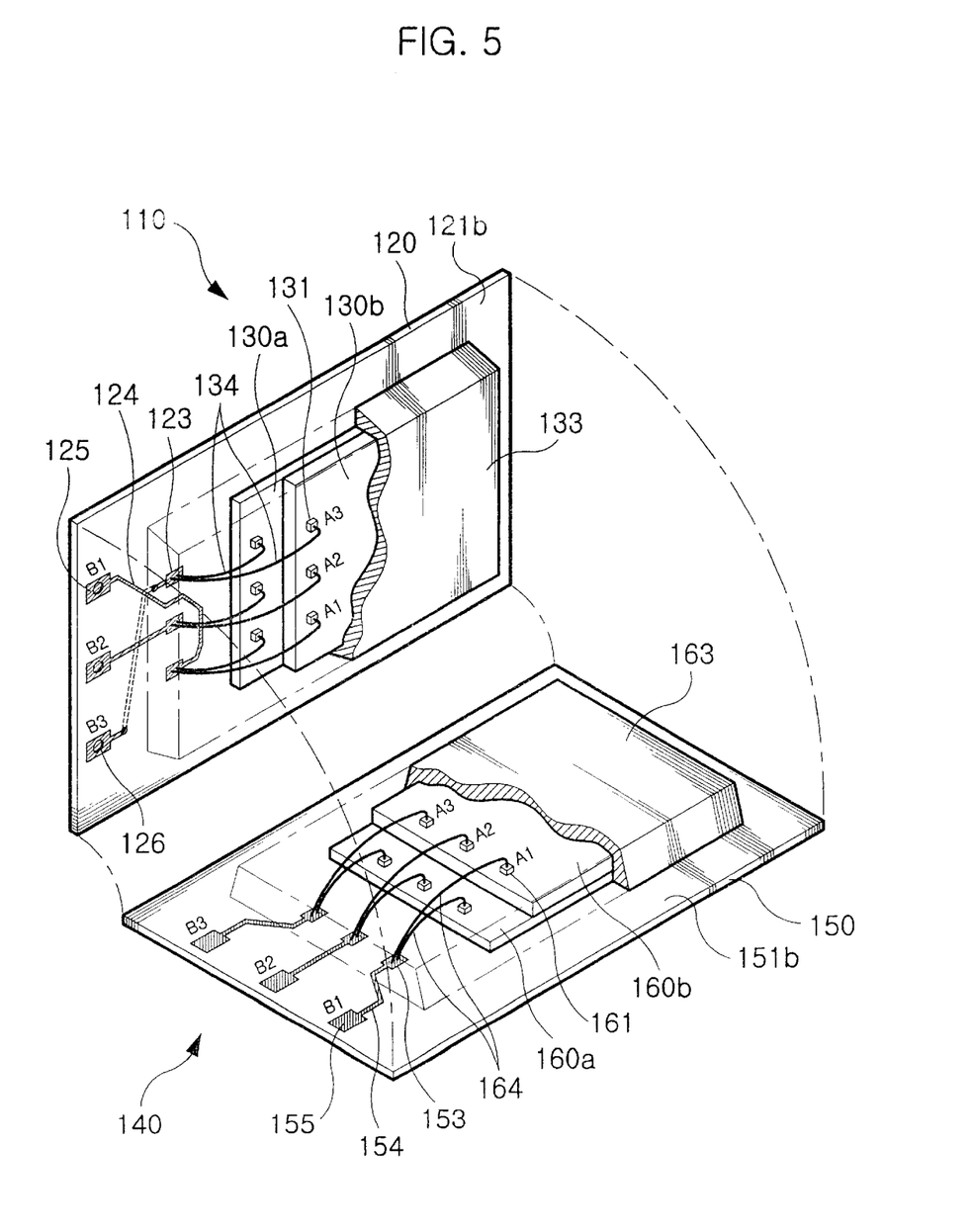
FIG. 5 is an isometric view showing a connection method between the chip pads of the upper and the lower packages of the memory card in the present invention.

Each package 110 or 140 comprises a corresponding substrate 120 or 150. With reference to FIGS. 3, 4 and 5, the structure of each package 110, 140 is described below. The memory chips 130a, 130b or 160a, 160b are mounted on inner surface 121b or 151b of the substrate 120 or 150. The substrate 120 or 150 is placed on the base card 170, and an encapsulant 133, 163 is used to protect the mounted chips. Printed circuit boards or wiring films are used as the substrates 120, 150. A polymer material such as an epoxy-molding compound is used as the encapsulant 133, 163. As well known, the printed circuit board is made by forming copper wirings on an insulating plate such as BT resin (Bismaleimide Triazine Resin), FR-4, or FR-5, and the wiring film is made by forming copper wirings on the polyimide film. Alternatively, other conventional methods or material to form the printed circuit board or the wiring film can be utilized for the purpose of the present invention.

The copper wirings form substrate pads 123, 153, wiring patterns 124, 154, and connection pads 125, 155 on the inner surface 121b, 151b of the upper and the lower packages 110, 140, and external connection pads 122 on an outer surface 121a near an edge of the upper package 110. The connection pads 125 of the upper package 110 are electrically connected to the external connection pads 122 through via holes 126 formed through the substrate 120. The substrate pads 123, 153, the connection pads 125, 155, and the external connection pads 122 preferably are plated with nickel or gold. Further, the inner walls of the via holes 126 preferably are plated with copper. The external connection pads 122 provide electrical connection to an external system (not shown), when the memory card is inserted to the external system such as the MP3 player or the digital camera. The external connection pads 122 are formed on only one surface of the memory card 100, that is, the upper package 110. FIG. 4 describes nine (9) external connection pads 122 aligned in a row. However, the present invention allows many variations and modifications in the number and the arrangement shape of the external connection pads. FIG. 5 shows three (3) connection pads 125, 155, three (3) substrate pads 123, 153 and three (3) chip pads 131, 161. However, actual number of each group of pads is the same as the number of the external connection pads 122, e.g., nine (9) and is reduced in the drawings for simplicity.

Two identical memory chips 130a, 130b, or 160a, 160b are mounted on the corresponding substrate 120, or 150. The lower chips 130a, 160a are attached to the inner surfaces 121b, 151b by an adhesive (not shown), and the upper chips 130b, 160b are stacked on the lower chips 130a, 160a. Herein, the chip pads 131, 161 of the memory chips 130a, 130b, and 160a, 160b are formed on one edge of the upper surface of each chip. The upper chips 130b, 160b are stacked on the lower chips 130a, 160a, and are off-set from an edge of the lower chips to expose the chip pads 131, 161 of the lower chips 130a, 160a. As for memory chips 130a, 130b and 160a, 160b, non-volatile memory chips such as NAND-type or NOR-type flash memory chips are preferably used. Further, a controller chip 132 (not shown in FIG. 5) can be additionally used. If the controller chip is installed on the external system (not shown), the controller chip needs not be mounted on the memory card 100.

The chip pads 131, 161 are electrically connected to the corresponding substrate pads 123, 153 with bonding wires 134, 164. Two bonding wires 134 or 164, which interconnect the upper chip 130b or 160b to the lower chip 130a or 160a, are connected in common to a single substrate pad 123 or 153. The substrate pads 123 or 153 are connected to the connection pads 125 or 155 through the wiring patterns 124 or 154. Accordingly, each of the connection pads 125, 155 is electrically connected to two chip pads 131, 161.

When the upper and the lower packages 110, 140 are mechanically connected to the base card 170, the connection pads 125, 155 of each package 110, 140 are connected to internal connection means 171 on the base card 170. Therefore, the connection pads 125, 155 are connected to each other through the internal connection means 171, and thereby electrically connected to the external connection pads 122. Since one external connection pad 122 is electrically connected to four (4) chip pads 131, 161 through two (2) connection pads 125, 155, the memory card 100 has a fourfold (extended) density, compared to the density of any one memory chip 130a, 130b, 160a, or 160b.

The internal connection means 171 formed on the base card 170 are metal patterns, preferably made of copper. The metal patterns 171 can be formed with the similar method of forming the copper wirings on the substrates 120, 150. Preferably, portions of the metal patterns 171, i.e., the portions contacting the connection pads 125, 155 of the substrate 120, 150, are plated with solder. As above-described, the packages 110, 140 are mechanically connected to the base card 170 through the adhesion sheet 172, and this process is carried out at 200° C. temperature. Therefore, if the metal patterns 171 are plated with solder comprising lead and tin in a ratio of 4:6 having a melting point around 200° C., the connection pads 125, 155 can be connected to the metal patterns 171 without any additional process steps.

The chip pads 131, 161 having the same function are connected in common to the same substrate pad 123, 153, respectively, and eventually to the same external connection pad 122. Because the upper and the lower packages 110, 140 are connected to the base card 170, the upper and the lower packages 110, 140 being positioned opposite to each other, the chip pads 131 of the upper package 110 and the chip pads 161 of the lower package 140 face each other. Therefore, in order to connect the chip pads 131 to the corresponding chip pads 161 having the same function as the chip pads 131, the present invention preferably employs two methods described in detail below.

As shown in FIG. 5, one method is to use the substrates 120, 160, each having the connection pads 125 or 155, which face each other. The four memory chips 130a, 130b and 160a, 160b mounted on the upper and the lower packages 110 and 140, respectively, are all the same devices. For example, the chip pad 131 (A1) of the upper package 110 corresponds with the chip pad 161 (A1) of the lower package 140. Because the upper and the lower packages 110, 140 oppose each other, if the same substrates were used, the connection pads 125, 155 would not correspond with each other. Instead the substrates must be mirror images of one another. Therefore, the wiring patterns 124 on one of the substrates (the substrate 120 of the upper package 120 in FIG. 5) are formed in a manner that the chip pad 131 (A1) corresponds to the connection pad 125 (B3). Thus, the connection pads 125, 155 of the substrates 120, 150 face each other. Further, the connection pads 125, 155, respectively connected to two corresponding chip pads 131, 161, can be connected to the same external connection pads 122 shown in FIG. 4.

Figure 6:
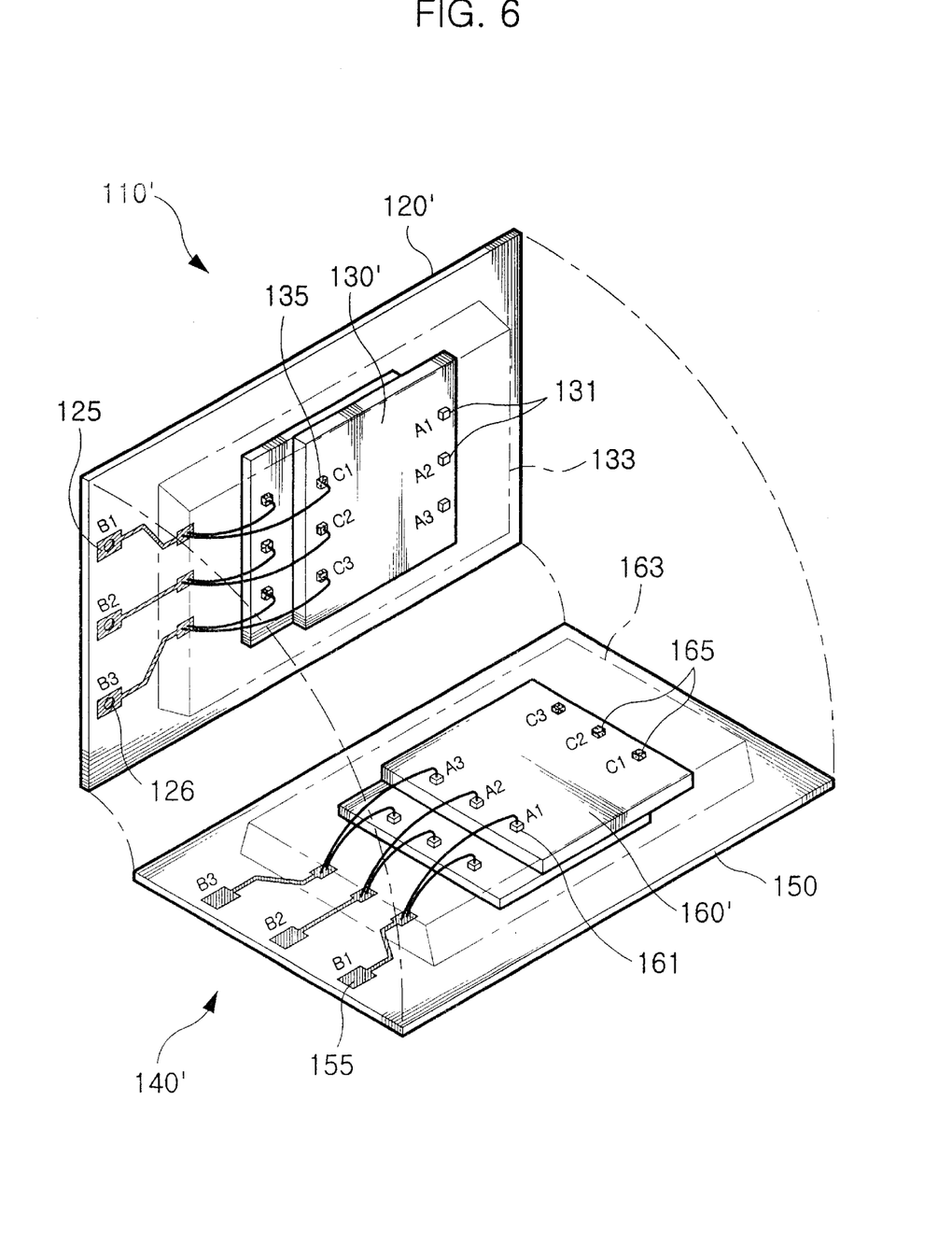
FIG. 6 is an isometric view showing another connection method between the chip pads of the upper and the lower packages of the memory in the present invention.

Alternatively, as shown in FIG. 6, memory chips 130', 160' having dummy pads 135, 165 formed thereon can be used to implement the present invention. The dummy pads 135, 165 correspond with the chip pads 131, 161. The dummy pads 135, 165 are formed on the other edge being opposite to the edge provided with the chip pads 131, 161, respectively. For example, in FIG. 6, the dummy pads 135 (C1), 165 (C1) correspond with chip pads 131 (A1), 161 (A1), respectively. By using the memory chip 130, 160 having the dummy pads 135, 165, two packages 110, 160 can employ the same substrates 120, 150, i.e., substrates having identical wiring or printed circuit patterns. In this embodiment, the chips 130' or 160' of either package are stacked turned around 180° degrees. That is, the chip pads 161 (A1) of the lower package 140' and the dummy pads 135 (C1) of the upper package 110' are respectively connected to the corresponding connection pads 125 (B1), 155 (B1) to be connected to the same external connection pads 122 shown in FIG. 4.

Another embodiment of the present invention uses via holes as the internal connection means between the base card and the packages and is described with reference to FIG. 7. Two packages 210, 240 are fixedly mounted within the base card 270. And the space between two packages 210, 240 and the base card 270 is filled with the liquid adhesive 272. Herein, via holes 271 formed through the base card 270 are used as the electrical internal connection means. An epoxy-resin compound with a predetermined viscosity can be used as the liquid adhesive 272. The via holes 271 of the base card 270 are plated or filled with a conductive material such as copper or solder.

As shown in FIG. 7, two memory chips 230, 260 are mounted side-by-side on each substrate 220 or 250 within the memory card 200. Herein, the chip pads need not be formed on only one edge of the chips, and the two same functional chip pads need not wire-bonded in common to one substrate pad. Although the same functional chip pads are connected to different substrate pads, eventually the chip pads can be connected to the same connection pad through the wiring patterns. Further, to electrically connect the memory chips 230, 260 to the substrates 220, 250, other conventional techniques such as flip chip bonding using the metal bumps 234, 264 can used rather than wire bonding.

Figure 8:
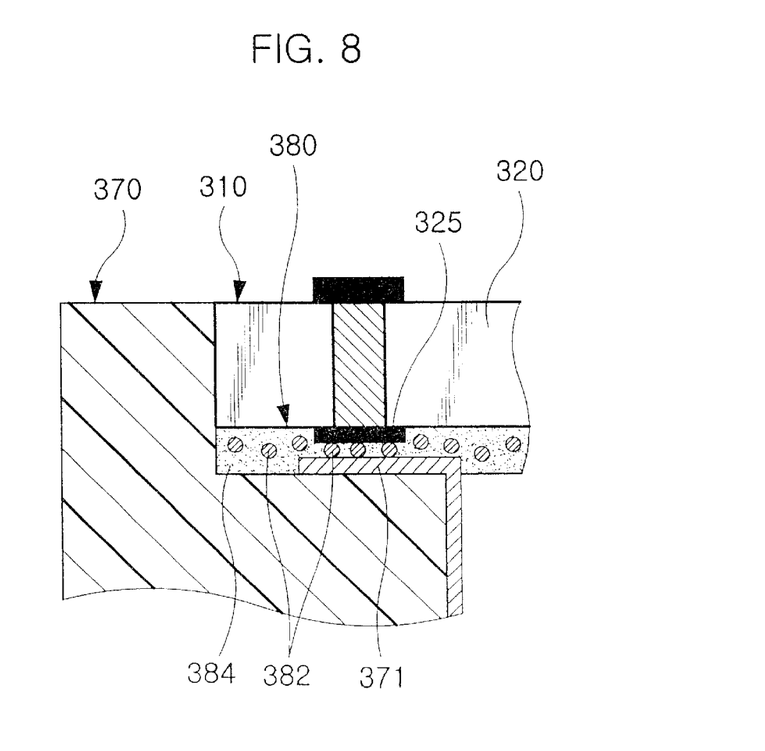
FIG. 8 is a cross-sectional view of a memory card in accordance with still another embodiment of the present invention.

Hereinafter, still another embodiment of the present invention is described with reference to FIG. 8. This embodiment uses an anisotropic conductive film (ACF) to electrically interconnect the base card and the packages. As shown in FIG. 8, the anisotropic conductive film 380 is interposed between the internal connection means 371 of the base card 370 and the substrate 320 of the package 310. The connection pads 325 of the substrate 320 are electrically connected to the internal connection means 371 of the base card 370 through conductive particles 382 within the anisotropic conductive film 380. The anisotropic conductive film 380 comprises the conductive particles 382 within a resin 384. When the package 310 is pressed to the base card 370 by the thermocompression, the conductive particles 382 are fixed between the connection pads 325 and the internal connection means 371, thereby providing an electrical path. Therefore, the anisotropic conductive film 380 physically connects the substrate 320 to the base card 370.

In all the above-described embodiments, two memory chips are mounted on each package. If the memory chip is miniaturized and more than two memory chips are mounted on each package, this will still fall within the spirit and scope of the present invention. For example, a plurality of chips or a plurality of two-chip stacks may be mounted side by side. Therefore, it is possible to increase the density of the memory card four times or more. However, in case of mounting several chips on one package, a trade-off between the memory density extension and loss caused by the test failure, and the increase of the production cost due to the use of the KGD should be considered.

As described above, the present invention has advantages in that the density of the memory card can be increased without increasing the number of the memory chip mounted in a package by connecting two substrates in one memory card. That is, the present invention prevents the problems encountered in the conventional smart card manufacturing process or the test process due to use of plural memory chips, and increase the density of the memory card.

Although preferred embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A memory card comprising:
   a base card having an opening extending therethrough in a center portion thereof; and
   first and second packages fixedly mounted within the opening of the base card and facing each other,
   said first package including:
      a first substrate having a first surface and a second surface, said first surface having a plurality of external connection pads formed thereon and exposed from the memory card, and said second surface having first connection pads formed thereon; and
      a first memory chip mounted on the second surface, the first memory chip electrically connected to the first connection pads; and said second package including:
      a second substrate having a third surface and a fourth surface, said third surface exposed from the memory card, and said fourth surface having second connection pads formed thereon; and
      a second memory chip mounted on the fourth surface, the second memory chip electrically connected to the second connection pads;
   wherein the base card includes internal connection means, and the first and the second connection pads are electrically connected to the internal connection means, and
   wherein the external connection pads provide electrical connection between said internal connection means and an external system.

2. The memory card of claim 1, wherein the second surface of the first package and the fourth surface of the second package are encapsulated with a molding compound to protect the memory chips therein.

3. The memory card of claim 1, further comprising one or more additional chips electrically interconnected to the first chip and one or more additional chips are electrically interconnected to the second chip.

4. The memory card of claim 1, wherein the internal connection means of the base card are metal patterns formed along a surface of the base card.

5. The memory card of claim 2, wherein the internal connection means of the base card are metal patterns formed along a surface of the base card.

6. The memory card of claim 1, wherein the internal connection means of the base card includes via holes formed through the base card, said via holes having therein a conductive material.

7. The memory card of claim 2, wherein the internal connection means of the base card are via holes formed through the base card, said via holes having therein a conductive material.

8. The memory card of claim 1, further comprising an adhesive sheet or a liquid adhesive interposed between each package and the base card to connect each package to the base card.

9. The memory card of claim 2, further comprising an adhesion sheet or a liquid adhesive interposed between each package and the base card to connect each package to the base card.

10. The memory card of claim 1, further comprising an anisotropic conductive film interposed between the internal connection means of the base card and the package to connect each package to the base card physically and electrically.

11. The memory card of claim 2, further comprising an anisotropic conductive film interposed between the internal connection means of the base card and the package to connect each package to the base card physically and electrically.

12. The memory card of claim 1, wherein the memory chips are stacked on each substrate, the chip stacked on top being off-set from an edge of an underlying chip.

13. The memory card of claim 2, wherein the memory chips are stacked with lateral off-set on each substrate.

14. The memory card of claim 1, wherein the memory chips are mounted side-by-side on each substrate.

15. The memory card of claim 2, wherein the memory chips are mounted side-by-side on each substrate.

16. The memory card of claim 1, wherein the memory chips are a non-volatile memory chip.

17. The memory card of claim 2, wherein the memory chips are a non-volatile memory chip.

18. The memory card of claim 1, wherein the first package further includes a controller chip.

19. The memory card of claim 2, wherein the first package further includes a controller chip.

20. The memory card of claim 1, wherein the first and the second substrates are a printed circuit board.

21. The memory card of claim 2, wherein the first and the second substrates are a printed circuit board.

22. The memory card of claim 1, wherein the first and the second substrates are wiring films.

23. The memory card of claim 2, wherein the first and the second substrates are wiring films.

24. The memory card of claim 1, wherein the first and the second connection pads face each other.

25. The memory card of claim 2, wherein the first and the second connection pads face each other.

26. The memory card of claim 1, wherein the memory chip comprises dummy pads facing chip pads.

27. The memory card of claim 2, wherein the memory chip includes dummy pads facing chip pads.

28. The memory card of claim 1, wherein the base card has first and second ledges to support the first and second substrates, respectively, within the opening.

29. The memory card of claim 1, wherein the opening is sized to receive the first and second packages from a top and bottom of the base card, respectively.

* * * * *